United States Patent [19]

Jun

[11] Patent Number: 4,920,445
[45] Date of Patent: Apr. 24, 1990

[54] JUNCTION-BREAKDOWN PROTECTION SEMICONDUCTOR DEVICE

[75] Inventor: Dong Soo Jun, Taegu, Rep. of Korea

[73] Assignee: Samsung Semiconductor and Telecommunications Co., Ltd., Gumi, Rep. of Korea

[21] Appl. No.: 121,843

[22] Filed: Nov. 17, 1987

[30] Foreign Application Priority Data

Nov. 19, 1986 [KR] Rep. of Korea .............. 86-9799

[51] Int. Cl.$^5$ .................................. H02H 3/20
[52] U.S. Cl. .................................. 361/91; 361/56; 361/111; 357/23.13
[58] Field of Search ................ 361/56, 91, 101, 111; 357/23.13, 42

[56] References Cited

U.S. PATENT DOCUMENTS

| | | | |
|---|---|---|---|
| 4,541,002 | 9/1985 | Shimada | 357/23.13 X |
| 4,546,401 | 8/1985 | Suedberg | 361/91 |
| 4,694,315 | 9/1987 | Suedberg | 361/56 X |
| 4,716,489 | 12/1987 | Imamura et al. | 361/101 X |
| 4,723,081 | 2/1988 | Akatsuka | 361/91 X |
| 4,725,915 | 2/1988 | Jwahashi et al. | 361/91 |
| 4,739,378 | 4/1988 | Ferrari et al. | 361/91 X |
| 4,739,437 | 4/1988 | Morgan | 357/23.13 X |
| 4,739,438 | 4/1988 | Sato | 361/91 |

Primary Examiner—Derek S. Jennings
Attorney, Agent, or Firm—Cushman, Darby & Cushman

[57] ABSTRACT

A junction-breakdown protection semiconductor device provides a well region which prevents the junction between a metal conductor and a diffused region from breakdown even under a high voltage or high current input. The junction-breakdown protection semiconductor device includes a metal conductor to which a high voltage is applied a semiconductor region of high impurity concentration having a conductivity type which is opposite to the conductivity type of the substrate is connected to the metal conductor through an opening in an insulating film. A second semiconductor region of the same conductivity type as the first semiconductor region is formed deeper in junction depth than the first semiconductor region under the opening in the insulator for ohmic connection on the surface of the first semiconductor region. This invention has the advantage of increased margin even with a alignment error of the ohmic connection in the fabricating process and thus provides an increased reliability of the semiconductor device.

4 Claims, 2 Drawing Sheets

JUNCTION-BREAKDOWN PROTECTION SEMICONDUCTOR DEVICE

BACKGROUND OF THE INVENTION

This invention is related to a junction-breakdown protection semiconductor device, especially for protection of a shallow junction under a high voltage or high current condition.

Currently, the higher packing density of a semiconductor device, the smaller the device size which is used. Also, due to geometrical effects of semiconductor devices (e.g. the short channel effect, the narrow width effect, and so on), vertical dimensions are so small that the diffused junction depth reaches is as small as 0.25 μm.

But semiconductor devices of shallow junction depth have been fabricated without consideration of the junction breakdown between the metal conductor and shallow junction caused by a high input voltage or high input current. For example, in high packing density semiconductor memory devices composed of field effect transistors, an input protection circuit or gate protection circuit is connected to the input pad for prevention of isolation breakdown of internal transistors caused by electrostatic discharge.

Especially, in the input protection circuit composed of diffused resistors or clamp diodes, the connection between the wire bonding pad and the diffused layer of the semiconductor device is formed as an ohmic connection by a metal conductor.

But because of the ohmic connection edge made by an etching process or a defect of the semiconductor substrate itself, or by a pit or spike on the semiconductor surface in the ohmic connection region between said metal conductor and diffused junction, or by a high voltage caused by an electrostatic discharge which is input of said metal conductor, the junction of said connection area may burn out, and semiconductor the substrate and said metal conductor will become a short circuit. This is because the strong electric field caused by the voltage difference between the semiconductor substrate, which is typically at ground potential, and said metal conductor to which a high voltage is applied is applied to said edge, pit or spike.

Short circuit phenomena caused by said junction breakdown between the metal conductor and the substrate occur not only at the ohmic connection area between the input pad and the diffused layer but also at ohmic the connection area between metal the conductor and the diffusion area, which is a boost node which accommodates high current in semiconductor devices. For example, in semiconductor devices designed for 5 volt operation, a short-circuited junction can be caused by strong a electric field confined to a surface spike or pit at the ohmic connection area of the boost node where the operating voltage is boosted to 8 volt.

SUMMARY OF THE INVENTION

The purpose of this invention is to provide a semiconductor device with a well region which prevents the junction between the metal conductor and the diffused region from breakdown even under a high voltage input or high current input.

In accordance with an embodiment of the invention, a deep diffused region of low concentration and of the same conductivity type as that of the diffused region described below, is formed under the metal conductor and the diffused region where a high voltage or current is applied.

DETAILED DESCRIPTION OF THE PREFERRED EMBODIMENT

A detailed description of the preferred embodiment of this invention will be given with reference to the Figs.

Figure 1:
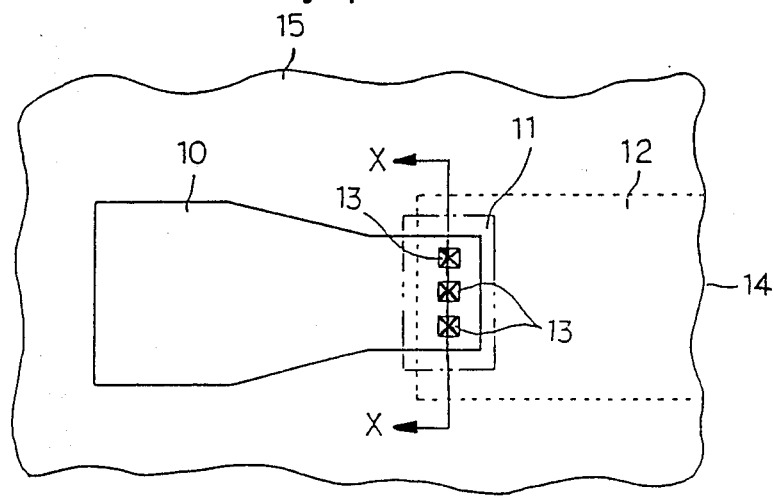
FIG. 1 is plan view of input pad region of a semiconductor device in accordance with the invention.

FIG. 1 is a plan view of an input protection circuit applied to semiconductor device with a well for junction-breakdown protection in accordance with this invention.

In this figure, input pad 10 is a metal conductor layer formed on top of thick field oxide, 15 and is composed of Al or the like. The pad 10 is connected to an external pin by bonding wire and one end of the above-mentioned input pad 10 is connected to a second semiconductor region 12 of high impurity concentration through opening 13 as an ohmic contact. Under the ohmic contact region with second semiconductor region 12 through opening 13, is formed a first semiconductor region 11 of low impurity concentration and of the same conductivity type as that of the second semiconductor region 12, and which is deeper than the second semiconductor region 12. A 3000–4000 Å thick field oxide layer is formed in the region 15 outside said second semiconductor region 12.

Said second semiconductor region 12 forms a semiconducting layer as a diffusion region of high concentration and is connected to an input protection circuit, not illustrated, through end 14.

Figure 2:
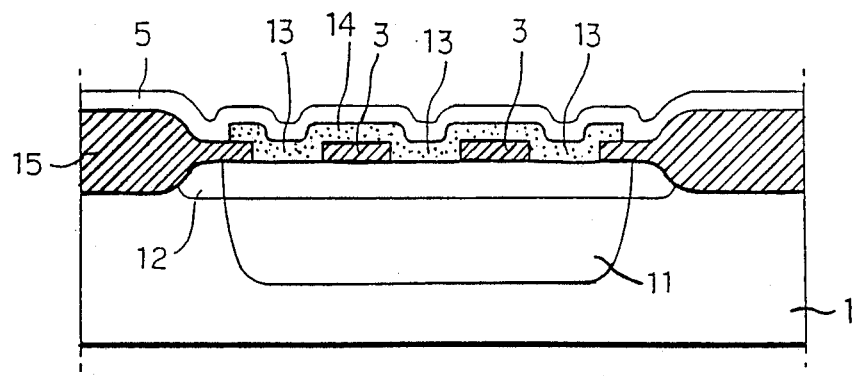
FIG. 2 is a cross-sectional view taken along line x—x' in the FIG. 1.

FIG. 2 is a cross-sectional view taken along with line x—x' in the FIG. 1.

In the figure, on the semiconductor substrate of first conductivity type, first semiconductor region 11 of opposite conductivity type is formed, and second semiconductor region 12 which has a high concentration, shallow junction depth, and the same conductivity type as that of first semiconductor region 11, is formed for ohmic connection. A thick field oxide layer 15 is formed at the surface outside the second semiconductor region 12. An opening 13 is formed between oxide layer 3 of about 1000 Å thickness for connection with said second semiconductor region of high concentration and the first semiconductor region is formed under the opening 13. A metal conductor layer 14 is connected to the pad 10 in FIG. 1 through the opening 13 and passivation layer 5 of BPSG (Boro Phospho Silicate Glass) or PSG is formed over the entire semiconductor surface.

As a specific embodiment of this invention, the size of said opening 13 is selected to be 1.4×1.4 μm, the distance between the openings 13 is selected to be 1.8 μm, and the number of openings is three but it can be easily understood to those who have common knowledge in this field that formation of many openings with sufficient separation gives decreased ohmic resistance and smooth coverage of the metal conductor layer.

First semiconductor region 11 is of low concentration, whose conductivity type is the same as that of second semiconductor region 12 and opposite to that of the substrate, is formed about 3–5 μm deep and must be formed under said opening 13 for ohmic connection.

Therefore, under the assumption of high input voltage through the input pad 10 of FIG. 1, although the strong electric field is confined to pit or spike at the opening 13 on the surface of the second semiconductor region 12, junction-breakdown between said metal conductor layer 14 and semiconductor substrate 1 does not occur due to the first semiconductor region of low concentration 11 which is at least tens times deeper than the second semiconductor region 12 and has the same conductivity type as that of the second semiconductor region 12. This is because the intensity of the electric field between metal conductor layer 14 and semiconductor substrate 1 is in inverse proportion to junction depth.

Moreover, the fabrication of said first semiconductor region is done during the formation of the well region in the fabrication process of high packing density CMOS semiconductor devices, and the other process are done by conventional fabrication processes.

Figure 3:
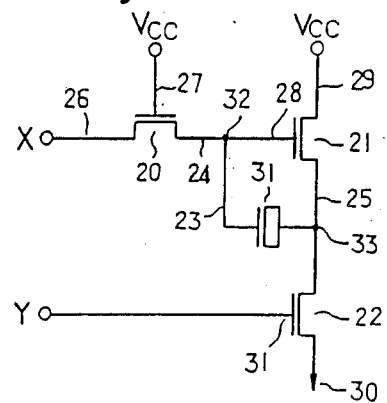
FIG. 3 is a circuit diagram of a boost generator.

FIG. 3 is a circuit diagram of a boost generator with boost node used in a conventional DRAM. Input terminal X is connected to drain 26 of pass transistor 20 and its gate 27 is connected to power supply voltage Vcc through polysilicon line 27. A source of said transistor 20 is connected to the gate of MOS transistor 21 through the metal conductor line 24 and polysilicon line 28, and is connected to the gate of MOS transistor 31 which forms a capacitor, through polysilicon line 23.

A drain of said MOS transistor 21 is connected to metal conductor layer 29 which supplies power supply voltage Vcc, and the source of said transistor 21 is connected to the source and drain of said transistor 31 in common and to the drain of MOS transistor 22 through metal conductor line 25.

The gate of said MOS transistor 22 is connected to input terminal Y through polysilicon line 31 and its source is grounded through metal conductor line 30. Therefore, if the HIGH state level (Vcc voltage) is applied to input terminal Y, then MOS transistor 22 goes to the ON state and the logic state of output node point 33 goes to the LOW state (ground state).

Now, if the HIGH state (Vcc voltage) is input to the X input terminal under the condition that MOS transistor 22 is OFF owing to the LOW state input of the Y input terminal, then MOS transistor 20 goes to the ON state, then at node point 32 appears voltage Vcc-$V_T$ which is dropped from Vcc by threshold voltage $V_T$ of MOS transistor 27, then MOS transistor 21 goes to ON state, then node point 33 of the source of said MOS transistor 21 rises to the power supply voltage Vcc. Then the voltage of said nose point 32 rises to Vcc+2 $V_T$, boosted by boost capacitor 31.

Therefore, a voltage higher than Vcc by 2 $V_T$ appears at node point 32, and higher voltage than the above can appear at node point 32 depending on the design of MOS capacitor 31. Therefore, a short circuit, as mentioned before, can appear at ohmic connection region between the source diffusion region of MOS transistor 20 and metal conductor line 24. When the size of MOS transistor 21 is big and current through MOS transistor is large, high a voltage induced by the voltage drop across resistor due to said high current at the ohmic connection region between metal conductor line 29 which supplies power supply voltage Vcc and the drain diffusion region of said transistor 21, can cause a short circuit, as mentioned before. Therefore, a short circuit phenomena as mentioned above can be avoided by forming, as shown in FIG. 2, first semiconductor region 11 of the same conductivity type as that of the diffusion region described below under said node point 32 and an ohmic connection region between metal conductor line 29 and diffused drain region where high current flows.

Figure 4:
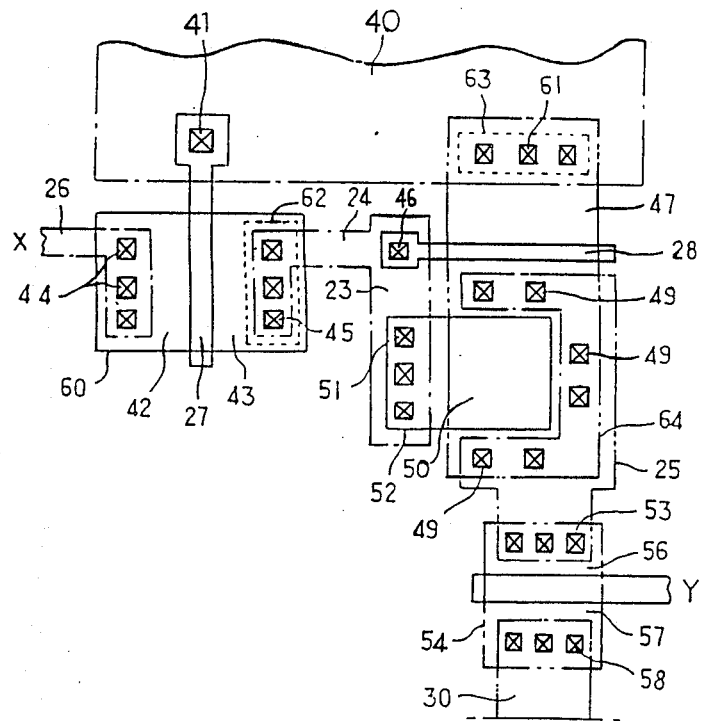
FIG. 4 is a plan view of the substrate of semiconductor device the FIG. 3.

FIG. 4 is a plan view of the boost generator in FIG. 3 realized on a semiconductor substrate. Input terminal X is connected to metal conductor line 26 and forms an ohmic connection with diffusion region 60 of high impurity concentration that is of opposite conductivity type to the semiconductor substrate and is formed by self aligned ion implantation through opening 44 after formation of polysilicon line 27. Under said polysilicon line 27, gate insulating film of MOS transistor 20 is placed in contact with the semiconductor substrate, and drain diffusion region 42 and source diffusion region 43 formed are by said diffusion region 60 having a high concentration and is placed beneath said gate insulating film. Source diffusion region 43 is connected to metal conductor line 24 through opening 45. The metal conductor line 24 is connected to polysilicon line 28 which forms gate electrode of MOS transistor 21 through opening 46 of lower insulating film. Below the metal conductor line is gate insulating film, after formation of polysilicon line 28, shallow diffusion region 64 of opposite conductivity type to that of substrate is formed by ion implantation as mentioned before and drain diffusion region 47 and source diffusion region 48 of MOS transistor 21 are formed as well. A polysilicon layer 50 formed on thin gate insulating film over said diffusion region 64 acts as the gate electrode of MOS capacitor and said polysilicon region 52 is connected to metal conductor line 23 through the opening 51 formed in the upper insulating film.

The drain and source diffusion region of MOS transistor 31 of FIG. 3 is connected to source diffusion region 48 of said MOS transistor 21 through opening 49 in the insulating film and metal conductor line 25 formed over said insulating film. A drain region 56 of high concentration diffusion region 54 of opposite conductivity type to the substrate is formed through polysilicon line 31 over gate insulating film of MOS transistor 22 by self alignment in the same way as mentioned before, and is connected to said metal conductor line 25 through opening 53 formed in insulating film and source diffusion region 57 of said transistor 22 which is grounded through opening 58 and metal conductor line 30. An end of diffusion region 64 and end of polysilicon line 27 act as the gate electrode of MOS transistor 20 are connected through openings 61 and 41 formed in insulating film to metal conductor line 40 where power supply voltage Vcc is applied.

Therefore the connection area in FIG. 4 which corresponds to the boost node point 32 in FIG. 3 is where metal conductor line 24 is connected to diffusion region 60 through opening 45 and a high-current flowing region is where metal conductor line 40 is connected to diffusion region 64 through 61. Therefore, formation of low-concentration deep diffusion region 62 and 63 of the same conductivity type as that of said diffusion region 60 and 64 under said opening 45 and 61 can avoid junction breakdown as mentioned before.

It is easily understood that a cross section of this region is the same as shown in FIG. 2. And it can be understood that the fabricating process of said diffusion region is the same as that of the well region of a conventional CMOS transistor.

Therefore, this invention, as mentioned before, has the advantage of increased margin even under alignment error of the ohmic connection fabricating process as well as increased reliability of semiconductor devices, by preventing semiconductor devices from failure due to electrostatic discharge during manual handling and from junction-breakdown at the boost node or in the region where high current flows, by formation of low-concentration diffusion region of said the conductivity type and at least ten times deeper than the diffusion region described before in order to avoid short circuit with ground due to junction-breakdown in the connection region of the metal conductor layer and diffusion region where high current flows.

What is claimed is:

1. In a semiconductor integrated circuit, a structure for preventing an electrical discharge breakdown at the junction of a metal pad conductor and a non-metallic conductive region of said semiconductor comprising;
    a semiconductor substrate having a first conductivity type;
    a first semiconductor region of high impurity concentration and having a conductivity type opposite to that of said first conductivity type;
    an insulating film over said first semiconductor region and having a plurality of openings therein;
    a metal pad conductor over said insulating film and extending through said plurality of openings to make electrical contact with said first semiconductor region; and
    a second semiconductor region of the same conductivity type as said first semiconductor region formed under said pad conductor and said first semiconductor region to a depth substantially deeper than said first semiconductor region.

2. The semiconductor integrated circuit of claim 1 wherein said second region is at least ten times deeper than said first semiconductor region.

3. In a semiconductor integrated circuit, a structure for preventing electrical discharge breakdown at the junction of a metal conductor and a non-metallic conductive region of said semiconductor integrated circuit comprising;
    a semiconductor substrate having a first conductivity type,
    a first semiconductor region of high impurity concentration having a conductivity type opposite to that of said first said conductivity type;
    an insulating film formed over said first semiconductor region;
    a metal conductor positioned over said insulating film and at least a portion of said first semiconductor region, said insulating film having a plurality of holes therein for permitting an electrical ohmic contact between said metal conductor and said first semiconductor region; and
    a second semiconductor region of the same conductivity type as said first semiconductor region having a lower impurity concentration than said first semiconductor region and formed substantially deeper than said first semiconductor region under the ohmic contact between said metal conductor and said first semiconductor region.

4. The integrated circuit of claim 3 wherein said second semiconductor region is at least ten times deeper than said first semiconductor region.

* * * * *